United States Patent [19] [11] 4,427,989
Anantha et al. [45] Jan. 24, 1984

[54] HIGH DENSITY MEMORY CELL

[75] Inventors: Narasipur G. Anantha, Hopewell Junction; Harsaran S. Bhatia; Santosh P. Gaur, both of Wappingers Falls; James L. Walsh, Hyde Park, all of N.Y.

[73] Assignee: International Business Machines Corporation, Armonk, N.Y.

[21] Appl. No.: 293,546

[22] Filed: Aug. 14, 1981

[51] Int. Cl.³ .......................................... H01L 29/74
[52] U.S. Cl. ...................................... 357/21; 357/89
[58] Field of Search ............................ 357/21, 22, 89

[56] References Cited

U.S. PATENT DOCUMENTS 3,868,718  2/1975  Arai ....................................... 357/22
4,328,511  5/1982  Tasch et al. .......................... 357/41

OTHER PUBLICATIONS

Arai "Charge-Storage Junction Field-Effect Transistor" IEEE Trans. Electron Devices, vol. ED-22 (4/75) pp. 181-185.

Primary Examiner—Gene M. Munson
Attorney, Agent, or Firm—Sughrue, Mion, Zinn, Macpeak and Seas

[57] ABSTRACT

A dynamic memory cell has a P+ injector region surrounded by an N+ region in an N− layer on an N+ layer. The injector region is placed between N+ source and drain regions. Holes injected into the N-layer are trapped by the high-low junctions at the N+, N− interfaces and are detected by sensing the source-drain current. Current levels are used to establish binary one and zero levels in the cell. Four masks in an aligned procedure simplify fabrication.

10 Claims, 9 Drawing Figures

READ  WRITE

HIGH DENSITY MEMORY CELL

BACKGROUND OF THE INVENTION

1. Field of the Invention

This invention relates to a high density, high performance memory cell. In particular, it relates to a dynamic storage device achieving high packing density that can be fabricated utilizing simple processing steps.

2. Prior Art

Developmental work in semiconductor memories and in particular to binary random access memories (RAM) has resulted in the number of bits of storage per chip increasing to approximately 64,000. At the same time, the cost per bit, due to increased processing efficiencies, has dramatically decreased. The computer industry has a standing requirement for increased storage capacity by the formation of small, reliable memory cells formed on a single chip. The formation of a large number of memory cells on a chip yields economies, in terms of cost per bit, so long as the processing steps allow for acceptable yield rates.

Individual chips interconnect to form a memory array. Since a significant portion of the total cost in the production of semiconductor chips is in the steps of interconnecting, packaging, testing, and the like, an increase in memory cell count per chip decreases a total number of chips which must be handled to form the memory array. Accordingly, a pacing criteria in the definition of improved semiconductor memories is to achieve greater packing densities while at the same time maintaining the process as simple as possible.

Within the prior art, a host of different techniques of forming descrete cells for semiconductor memories are known. Reference is made to U.S. Pat. No. 4,164,751 which summarizes a number of methods of making memory cells used in the construction of semiconductor memory chips.

A second requirement, mitigating against high packing density, is that each cell have a charge capacity per unit area which is at an acceptable level so that the charge stored therein is distinguishable from noise in the memory. As packing density increases, the number of cells per chip increases and therefore the size of each cell for a given chip area decreases. Accordingly, the amount of charge that can be stored in an individual cell decreases, reaching a point where the amount of stored charged is unacceptably low. A balancing packing density vs. signal strength is therefore a serious consideration.

U.S. Pat. No. 3,852,800 describes a memory storage cell utilizing the inherent metal-insulator-semiconductor capacitance and the P-N junction capacitance at the source node of a field effect transistor. In order to enhance charge storage, an extended portion of the source diffusion in combination with overlying thin oxide and metal layers forms a capacitor. Accordingly, the '800 patent utilizes a single IGFET with the binary data represented in the form of a stored charge arranged in a matrix of memory cells to define a random access memory.

U.S. Pat. No. 4,122,543 shows a variation of the MIS structure shown in the '800 patent by utilizing a second storage state having an MIIS element whose electric charge is controlled by the width of the channel formed between two depletion zones in a substrate which forms a first storage state. The MIIS structure is formed by a layer of metal covered by two layers of an insulator, the second being very thin and finally by semiconductor layer. The MIIS structure in the '543 patent acts when a positive voltage is applied to the metal layer with respect to the semiconductor layer. Electrons from the semiconductor pass through the thinnest insulating layer by tunnel effect and are trapped at the interface between the two interface layers. Alternatively, the electrons can be trapped in an ion implant area with the charge therein retained for a long period of time, in the order of one year. Erasure of the charge is obtained by applying a voltage in the opposite direction.

U.S. Pat. No. 4,164,751 also relates to a memory system integrated in a semiconductor substrate having an N+ region on a first surface of a semiconductor substrate forming a bit line and transistor source. A storage region is defined in the same surface spaced from the N+ region and comprises an N− type implant in the substrate near the first surface together with a P type implant in the substrate beneath the N type implant. An insulating layer is formed with a storage gate region and a transfer gate region formed overlying the insulating layer.

In each memory cell, the charge is stored in both an oxide capacitor and in a depletion capacitor. The oxide capacitor is defined by the storage gate and an N type implant separated by an insulating layer. The depletion capacitor is formed by a storage region defined by two ion implants near the surface of the memory cell.

Accordingly, while a variety of prior art devices utilize charge storage techniques, in MIS capacitors, P−N junction capacitance and depletion layer capacitance, all are categorized by a requirement of multiple, difficult processing steps. Hence, there still exists a requirement for a memory cell achieving high packing density yet manufactured by a relatively simple process. Power dissipation also remains a problem particularly in IGFET devices. While high packing densities are achieved, power dissipation in such devices remains a consideration. This shortcoming restricts overall array size tending to restrict overall memory size. Moreover special measures must be taken for power conditioning.

It is an object of this invention to define a dynamic memory cell having current flows smaller than in IGFET devices and one eliminating the requirement for thin film dielectrics.

Another object of this invention is to provide a dynamic memory array having low power dissipation and capable of being manufactured utilizing simple manufacturing techniques.

A further object of this invention is to provide a dynamic memory array achieving high packing density while having low power dissipation.

SUMMARY OF THE INVENTION

Given the shortcomings of the prior art, the present invention achieves high packing density while achieving a low power dissipation in a dynamic memory device utilizing high-low junction trapping of minority carriers. The storage device in accordance with the present invention utilizes a P+ injector region surrounded by a N+ region in a N− layer on a N+ region. The P+ injector region is positioned between a N+ source region and a N+ drain region. Holes injected into the N− layer are stored by the high-low-high junctions formed below the injector region and are detected by sensing of the source-drain current flow.

The fabrication of the memory cell requires the use of only four masks in a self-aligned process once the pattern for isolation in the substrate has been defined.

This invention will be described in greater detail by referring to the following description, illustrated by the drawings showing the preferred embodiment of this device.

DESCRIPTION OF THE PREFERRED EMBODIMENT

Figure 1:
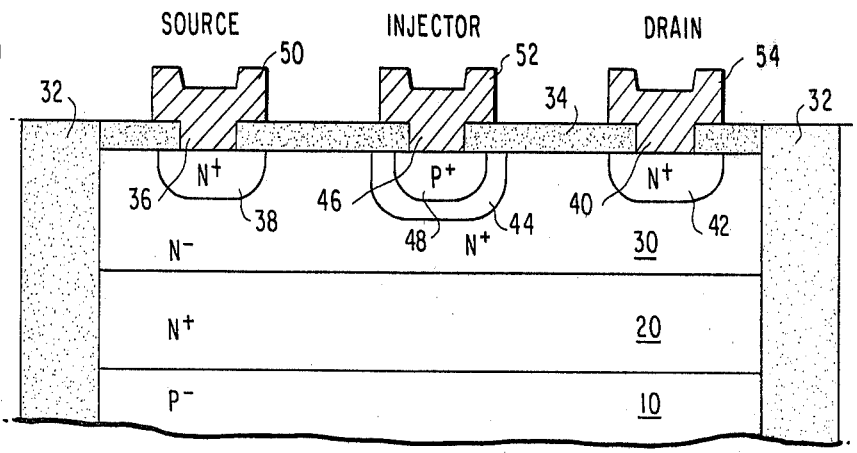
FIG. 1 is a partially cutaway perspective view showing the dynamic memory cell in accordance with this invention.

Referring now to FIG. 1, a schematic cross-sectional view of the completed cell in accordance with this invention is shown.

A semiconductor substrate of e.g. silicon is generally shown as element 10. The substrate may be either N-type or P-type depending on design considerations. For purposes of explaining this embodiment it will be assumed that layer 10 is a P-type substrate, of resistivity 10–20Ω-cm. On top of the substrate, a blanket subcollector N+ region 20 is formed upon which a N− epitaxial region 30 is grown. Isolation is achieved between memory cell units by deep dielectric isolation regions 32 formed on each side of the cell. A $SiO_2$ layer 34 covers the surface having subsequently etched open areas for source, drain and injector regions. At the source opening 36, an N+ implanted layer 38 is positioned. Below the drain opening 40, a second N+ implant 42 is positioned. A third N+ region 44 is implanted beneath the injector opening 46. A P+ region 48 is implanted above the N+ region 44. Metal lines 50, 52, and 54 are evaporated over the respective openings to define couplings to the source, injector and drain regions respectively. Metalization is known in the art to achieve separation between orthogonal (source-X and drain, injector-Y) lines.

The operation of the single cell shown in FIG. 1 is described as follows. If the P+ injector region 48 and the N+ source region 38 are held at ground potential and the N+ drain region 42 is biased with respect to the source, a small current will flow between the source and drain due to the high resistance of the N− region. If the P+ injector region 48 is forward biased with respect to the source region 38, holes are injected from the P+ region 48 to the N− region 30. High-low junctions exist at the interface between the N+ regions 20, 38, 42, and 44 and the N− epi 30. An electric field existing at those junctions opposes hole movement into the respective N+ regions. Accordingly, injected holes from the injector P+ region 48 will tend to be stored in the N− epi region 30.

As is known in this technology, the amount of holes stored depends on N− region doping, source and drain spacing, epi thickness and the forward bias on the P+ injector region. Storage, therefore, can easily be controlled by adjusting these parameters.

It is established in this technology that the lifetime of such injected holes in a low doped epitaxial region, such as region 30, can be very high. For example, reference is made to Borsuk et al, "High Speed Silicon CCDs Fabricated on High Lifetime Epitaxial Material", 37th Annual Device Research Conference, June 25, 1979, Univ. of Colorado, Boulder, Colorado.

Referring to FIG. 1, assume now that the P+ injector region is held at ground potential and the drain region 42 is biased with respect to the source, which is also held at ground potential. A large current will initially flow between the source region 38 and the drain region 42 due to holes stored in the N− region 30. After all the stored holes are depleted from the N− region, only a small current will flow due to the high resistance of the N− region. This increase in current can be sensed so that the presence or absence of stored holes in the N− region can be used to define binary one or binary zero values for the memory cell.

Because, as noted, the amount of holes stored in the N− region is easily controllable, the increase in current between source and drain due to holes stored in the N− region is also controllable. It is apparent, then, that the holes injected into the N− layer 30 are initially trapped by the high-low-high junctions existing below the injector region. Accordingly, the system operates with high efficienty yet with low power dissipation. Moreover, as shown in FIG. 1, utilizing deep dielectric isolation techniques, (DDI) high packing densities are achieved.

Figure 2:
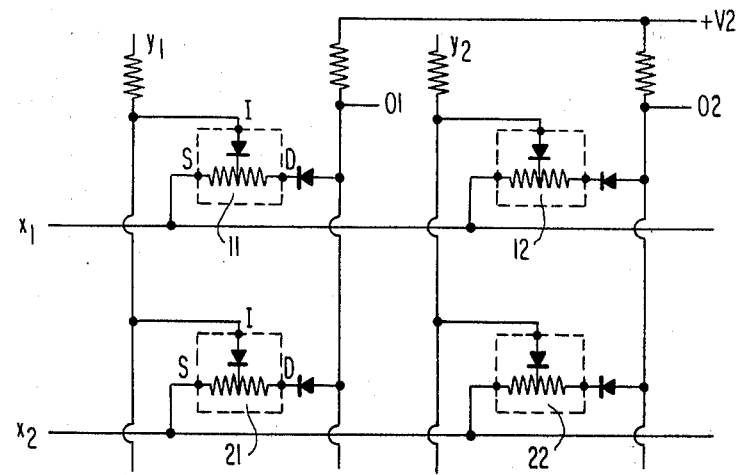
FIG. 2 is a schematic circuit drawing showing the dynamic random access memory cell of this invention.

FIG. 2 shows a circuit diagram representation of an array of memory cells forming a portion of a composite memory in accordance with this invention. It is understood that while only four cells in the array are shown, thousands are used to form a composite high density memory array. The array N×M elements may be symmetrical, N=M, or unsymmetrical. FIG. 2 shows four cells denoted in conventional row number as 11 and 12 in the first row and cells 21 and 22 in the second row. The column structure of cells 11 and 21 forming one column to define the numbering sequence for the array. Each memory cell shown schematically has a source (S) injector (I) and drain (D) terminals. Forward biasing of the injector with respect to the source is accomplished by the voltage applied on lines $y_1$, $y_2$ with respect to that imposed on lines $x_1$ and $x_2$. Lines $y_1$ and $y_2$ form the write lines in the array while lines $x_1$ and $x_2$ form the read lines with outputs $O_1$ and $O_2$, that is to determine the current flow from source S to drain D. The forward biasing reference voltage V2 is imposed on the drain line D via an external diode.

Figure 3:
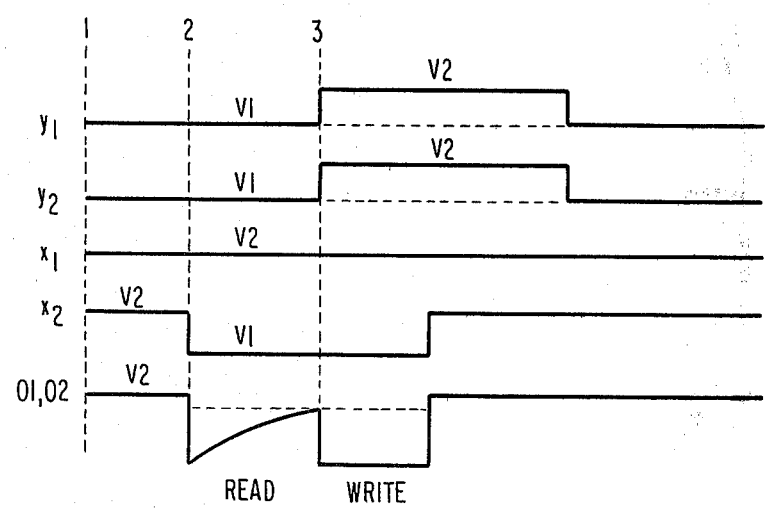
FIG. 3 is a timing diagram showing the operation of the FIG. 2 array.

Consider now the operation of the array of FIG. 2 and the timing diagram, FIG. 3. Initially lines $y_1$ and $y_2$ are held at a low level v1 shown in the timing diagram of FIG. 4. Lines $x_1$ and $x_2$ are initially held at the high level (v2). The diodes at the drain D for the cell have a zero applied bias since V2 is applied to both sides of the diode. Accordingly, there is no current flow and the outputs $O_1$ and $O_2$ are at the same high level, V2. This is shown in FIG. 3 at point 1. The variable resistor values of each of the cells are therefore either at the high state, that is, no charge stored, or at a low state, where minority carrier charges have been stored.

The cycle begins with a read operation shown as point 2 in FIG. 3. The operation will be discussed for devices 21 and 22 since simultaneous read out occurs. Line $x_2$ falls to a low potential (v1) and current flows into devices 21 and 22 but not into devices 11 and 12 since X1 is at the high level V2. The magnitude of the current is determined by the charge stored in devices 21 and 22 in the previous cycle. If no charge has been stored in device 21, the current has a low value and the output O1 falls by a small amount as indicated by the dotted line in FIG. 3. Also, O2 falls by a small amount if no charge had been stored in device 22.

If a charge has been stored in device 21 or 22 a larger current will flow and the output $O_1$ or $O_2$ falls to a lower level indicated by the solid line in FIG. 3. As the current flows through device 21 or 22, the stored charge is removed, the resistance increases and the current decays to a low value. The output rises to the level shown by the dotted line. A sense amplifier, not shown, is connected to output lines $O_1$ and $O_2$ to distinguish between the solid and dotted line waveforms of that output. Because the read operation as described removes stored charge, it becomes necessary to rewrite stored charge if such has been sensed. It is apparent that the read operation occurs simultanesouly for device 22.

To write stored charge into device 21 line y1 is raised to the high level (v2) as shown as point 3 in FIG. 3. This high level V2 is shown as the solid line for $y_1$ in FIG. 3. This is accomplished if charge has been sensed in the subsequent read operation and if it is desired to restore the old data. Accordingly, if restoration is desired, and if the old data was not a stored charge, then, line $y_1$ is held at the low level (v1). If new data is to be written, independent of any old data, y1 is raised to the level v2 to store charge or held at level v1 for no stored charge to take place. Device 22 is written simultaneously with device 21 but independently under the control of line $y_2$.

Cells 11 and 12 are not disturbed during the read or write operations on devices 21 and 22 because the diodes for those cells have not been forward biased. $X_1$ was held at the high level V2 during the read and write operations described above. Devices 11 and 12 are selected for read and write operations by lowering the voltage of line $x_1$ while holding line $x_2$ at a high value.

Referring now to FIG. 4, the steps of fabricating the dynamic memory cell of FIG. 1 are depicted. The substrate 10 is P type of resistivity in the range of 10–20Ω-cm. The blanket subcollector region 20, heavily doped typically with arsenic or antimony, is then formed on top of the P− substrate 10.

A lightly doped epitaxial region 30 of the same conductivity type as the subcollector region 20 is grown, typically with impurity doping in the range of $1.0 \times 10^{14} - 1.0 \times 10^{15}$ cm$^{-3}$. Region 30 is more lightly doped than region 20. Reoxidation of the epi layer 30 then takes place followed by the application of a resist material to define the memory cell pattern. Dielectric isolation techniques for complete isolation are preferable. These techniques are known in the technology, for example, as described in Bean and Ruyan, "Dielectric Isolation; Comprehensive, Current and Future", J. Electrochem. Soc., 124, 5 (1977).

Figure 4A:
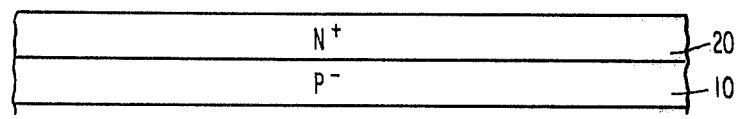
FIGS. 4A to 4F are cross-sectional views showing the successive process steps utilized to fabricate the dynamic memory cell of FIG. 1.
Figure 4B:
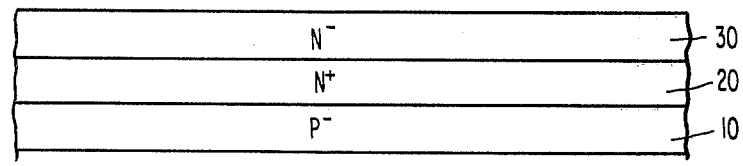
Figure 4C:
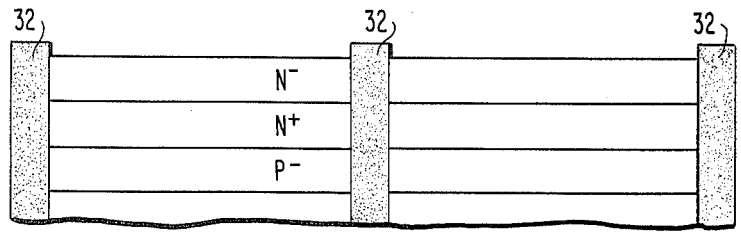
Figure 4D:
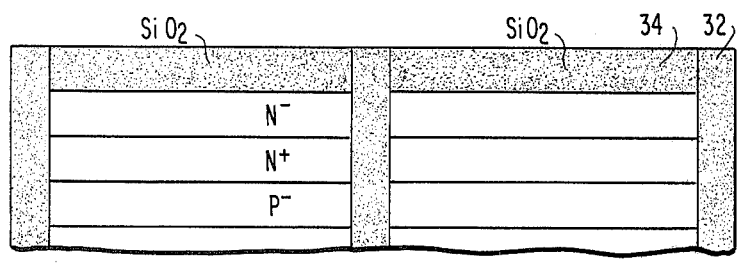
Figure 4E:
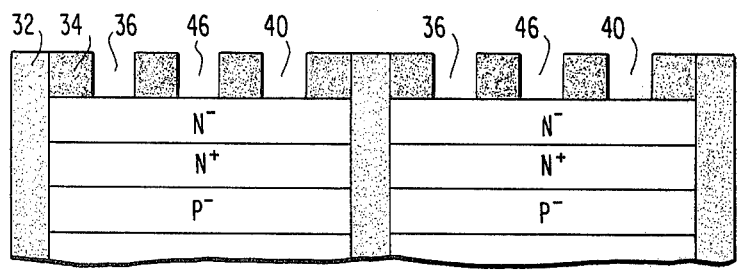

Once the DDI pattern has been completed, the oxide layer 34 is grown on the surface of the lightly doped layer 30, typically to a depth of 3000 Å. This is shown in FIG. 4D. Applying photoresist and using a first mask, areas are opened for the source, drain and injector regions in the oxide layer 34. The opening for the source is shown as element 36, for the injector as opening 46, and for the drain as opening 40.

Figure 4F:
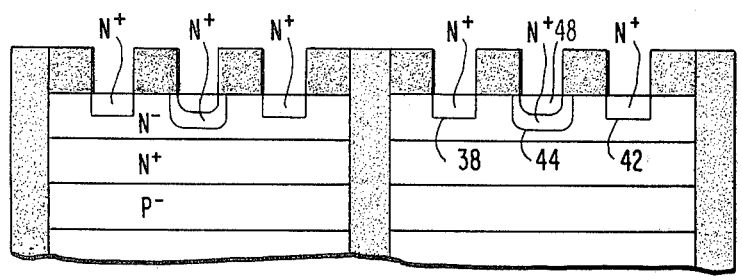

Then, utilizing a block-off mask, implantation of the N+ regions 38 and 42 for source and drain takes place by ion implantation of arsenic. This is followed by the use of a third mask to implant the N+ region 44 at the injector utilizing phosphorous implantation. As shown in FIG. 4F, once the source, injector and drain implant regions have been defined, implantation of the P+ injector region 48 takes place by boron implantation. Following implantation of the three regions annealing of the implanted impurities takes place followed by evaporation of the metal lines to define the complete memory cell pattern. The complete device is shown in FIG. 1.

It is apparent from FIG. 4 that only four masks are required once DDI has been established. Moreover, the masks overlay each other in a self-aligned manner. Standard semiconductor fabrication techniques are therefore used to define a high density dynamic storage device.

It is apparent that variations of this manufacturing process may be employed without departing from the essential scope of this invention. For example, while the substrate is shown as a P− type with the epitaxial region shown as the N type silicon, it is apparent that opposite conductivity types can be used. That is, the substrate can be formed of an N type silicon with the epitaxial layers formed of P type material. Similar reversal of the source, injector and drain regions will be necessary. Additionally, implantation impurities are not restricted to those defined with respect to FIG. 4. It is apparent that other suitable materials may be implanted or diffused to form the source, injector and drain regions.

What is claimed is:

1. A dynamic semiconductor memory cell comprising:
    a substrate;
    a first layer of one conductivity type formed on said substrate;
    a second layer of one conductivity type formed on said first layer, said second layer lightly doped with respect to said first layer;
    an injector region formed on the surface of said second layer of a doped opposite conductivity type;
    a heavily doped first region of said one conductivity type surrounding said injector region within said second layer; and
    heavily doped second and third regions of said one conductivity type formed on the surface of said second layer defining source and drain regions.

2. A dynamic storage device comprising:
    a substrate;
    a first layer of one conductivity type formed on said substrate;
    a second layer of one conductivity type formed on said first layer, said second layer lightly doped with respect to said first layer;
    deep dielectric isolation regions formed through said first and second layers and extending to said substrate defining a plurality of memory cell areas;
    an injector region in each memory cell area comprising a layer of a doped opposite conductivity type formed on the surface of said second layer and surrounded within said second layer by a heavily doped first region of said one conductivity type;
    source and drain regions in each memory cell defined by doped second and third regions of said one conductivity type formed on the surface of said second layer, and metal lines coupling respective regions in said one memory cell area to respective regions in a second memory cell area.

3. The apparatus of claims 1 or 2 further comprising an insulating oxide coating over said second layer.

4. The apparatus of claims 1 or 2 wherein said substrate comprises a layer of said opposite conductivity type.

5. The apparatus of claims 1 or 2 wherein said injector region comprises a Boron P+ implant.

6. The apparatus of claims 1 or 2 wherein said first, second and third regions comprise phosphorous N+ implants.

7. The apparatus of claims 1 or 2 wherein said source and drain regions are on opposite sides of said injector region.

8. The apparatus of claims 1 or 2 wherein said one conductivity type is N type silicon.

9. The apparatus of claim 2 wherein said memory cells comprise an N×M memory array.

10. The apparatus of claim 9 wherein N=M.

* * * * *